United States Patent
Hua et al.

(10) Patent No.: US 9,190,374 B2
(45) Date of Patent: Nov. 17, 2015

(54) STRUCTURE OF A SEMICONDUCTOR CHIP WITH SUBSTRATE VIA HOLES AND METAL BUMPS AND A FABRICATION METHOD THEREOF

(71) Applicant: WIN Semiconductors Corp., Kuei Shan Hsiang, Tao Yuan Shien (TW)

(72) Inventors: Chang-Hwang Hua, Tao Yuan Shien (TW); Chih-Hsien Lin, Tao Yuan Shien (TW)

(73) Assignee: WIN SEMICONDUCTORS CORP., Tao Yuan Shien (TW)

( * ) Notice: Subject to any disclaimer, the term of this patent is extended or adjusted under 35 U.S.C. 154(b) by 193 days.

(21) Appl. No.: 13/968,797

(22) Filed: Aug. 16, 2013

(65) Prior Publication Data
US 2014/0252602 A1 Sep. 11, 2014

(30) Foreign Application Priority Data
Mar. 6, 2013 (TW) .............................. 102107918 A

(51) Int. Cl.
*H01L 21/00* (2006.01)
*H01L 23/00* (2006.01)

(52) U.S. Cl.
CPC ............... *H01L 24/12* (2013.01); *H01L 24/11* (2013.01); *H01L 24/81* (2013.01); *H01L 2924/1305* (2013.01); *H01L 2924/1306* (2013.01)

(58) Field of Classification Search
CPC ......... H01L 24/12; H01L 24/11; H01L 24/81; H01L 2924/1305
See application file for complete search history.

(56) References Cited

U.S. PATENT DOCUMENTS

| | | | | |
|---|---|---|---|---|
| 7,521,799 B2* | 4/2009 | Hayashi et al. | ............... | 257/738 |
| 7,791,204 B2* | 9/2010 | Hayashi et al. | ............... | 257/773 |
| 7,868,441 B2* | 1/2011 | Eaton et al. | .................... | 257/686 |
| 7,921,551 B2* | 4/2011 | Yamashita et al. | .............. | 29/832 |
| 7,989,269 B2* | 8/2011 | Do et al. | ........................ | 438/127 |
| 8,018,066 B2* | 9/2011 | Hayashi et al. | ............... | 257/773 |
| 8,125,073 B2* | 2/2012 | Han et al. | ...................... | 257/698 |
| 8,411,450 B2* | 4/2013 | Yamazaki et al. | ............. | 361/749 |
| 8,941,790 B2* | 1/2015 | Kimura et al. | ................... | 349/39 |
| 8,963,309 B2* | 2/2015 | Do et al. | ........................ | 257/686 |
| 2004/0036172 A1* | 2/2004 | Azuma et al. | ................. | 257/738 |
| 2006/0244128 A1* | 11/2006 | Hayashi et al. | ............... | 257/712 |
| 2007/0037321 A1* | 2/2007 | Higashino et al. | ............ | 438/109 |
| 2007/0278619 A1* | 12/2007 | Clevenger et al. | ............. | 257/532 |
| 2009/0223705 A1* | 9/2009 | Yamashita et al. | ............ | 174/260 |
| 2009/0230531 A1* | 9/2009 | Do et al. | ........................ | 257/685 |
| 2010/0044853 A1* | 2/2010 | Dekker et al. | ................ | 257/692 |
| 2010/0246144 A1* | 9/2010 | Yamazaki et al. | ............. | 361/749 |
| 2011/0183474 A1* | 7/2011 | Shigemura et al. | ........... | 438/127 |
| 2011/0266652 A1* | 11/2011 | Do et al. | ........................ | 257/528 |

(Continued)

*Primary Examiner* — Laura Menz
(74) *Attorney, Agent, or Firm* — Muncy, Geissler, Olds & Lowe P.C.

(57) ABSTRACT

A structure of a semiconductor chip with substrate via holes and metal bumps and a fabrication method thereof. The structure comprises a substrate, at least one backside metal layer, at least one first metal layer, at least one electronic device, and at least one metal bump. The substrate has at least one substrate via hole penetrating through the substrate. The at least one first metal layer and electronic device are formed on the front side of the substrate. The at least one metal bump is formed on the at least one first metal layer. The at least one backside metal layer is formed on the backside of the substrate covering the inner surface of the substrate via hole and at least part of the backside of the substrate and connected to the first metal layer on the top of the substrate via hole.

14 Claims, 24 Drawing Sheets

(56) References Cited

U.S. PATENT DOCUMENTS

| | | | |
|---|---|---|---|
| 2011/0285930 A1* | 11/2011 | Kimura et al. | 349/43 |
| 2012/0018820 A1* | 1/2012 | Utsumi et al. | 257/416 |
| 2014/0252602 A1* | 9/2014 | Hua et al. | 257/737 |

* cited by examiner

Step 1. forming at least one electronic device and first metal layer on a front side of a substrate1, in which at least part of the at least one first metal layer is connected to at least one of the at least one electronic device; and forming at least one metal bump on the at least one first metal layer.

Step 2. forming a protection film on the front side of the substrate to cover the front side of the substrate, the at least one electronic device, the at least one first metal layer, and the at least one metal bump.

Step 3. forming a demounting film on the protection film to cover the protection film.

Step 4. mounting an upper substrate on the demounting film.

Step 5. grinding and polishing the backside of the substrate.

Step 6. forming at least one substrate via hole on the backside of the substrate penetrating through the substrate by using photolithography and etching techniques.

Step 7. depositing at least one backside metal layer on the backside of the substrate to cover the inner surface of the at least one substrate via hole and at least part of the backside of the substrate and to connect the at least one first metal layer on the top of at least one of the at least one substrate via hole.

Step 8. mounting a lower substrate to the backside of the substrate by using vacuum adsorption.

Step 9. demounting the upper substrate from the demounting film by heating; removing the demounting film and the protection film.

Step 10. removing the lower substrate by releasing the vacuum adsorption.

FIG. 3

STRUCTURE OF A SEMICONDUCTOR CHIP WITH SUBSTRATE VIA HOLES AND METAL BUMPS AND A FABRICATION METHOD THEREOF

FIELD OF THE INVENTION

The present invention relates to a structure of a semiconductor chip with substrate via holes and metal bumps and a fabrication method thereof, which can be used in the fabrication of the flip-chip bonded stacked chips, so that the integration of devices in a semiconductor chip can be improved, the chip size can be reduced, and the speed of signal transmission can be increased.

BACKGROUND OF THE INVENTION

In the fabrication process of a semiconductor device, in order to reduce the surface area of the semiconductor device, the flip-chip bonded stacked chips technology is developed, which uses copper bumps or solder bumps as bonding points between the bonded chips for signal transmission. FIG. 1A is a schematic showing the cross-sectional view of a semiconductor chip with copper bumps in a prior art, which comprises a substrate 101, a metal layer 103, a metal bump 105, and an electronic device 113. The electronic device 113 is formed on the front side of the substrate 101. The metal layer 103 is formed on the front side of the substrate 101 and connected to the electronic device 113. The metal bump 105 is formed on the metal layer 103. FIG. 1B is a schematic showing the cross-sectional view of flip-chip bonded stacked chips with copper bumps in a prior art, which is similar to the structure shown in FIG. 1A, except that an upper chip 135 is stacked on the metal bumps 105. The metal bumps 105 are connected to the upper chip 135. The electric signal from the electronic device 113 on the substrate 101 can be transmitted through the metal bumps 105 to the upper chip 135. A module substrate 133 is disposed under the substrate 101, and at least one bonding wire 137 is disposed on the module substrate 133. The electric signal from the electronic device 113 can be further transmitted through the bonding wire 137 to the module substrate 133.

Although the abovementioned design can form flip-chip bonded stacked chips, the density of the integration of the devices are limited, and thus the reduction of the chip size is restricted. The signal transmission speed can not be significantly increased, and therefore the electric power consumption of the circuit remains high.

To solve the abovementioned problems, the present invention provide a structure of a semiconductor chip with substrate via holes and metal bumps and a fabrication method thereof to achieve heterogeneous integration, to improve the integration of the devices, to reduce the chip size, to increase the signal transmission speed, to lower the electric power consumption, and to reduce the material cost.

SUMMARY OF THE INVENTION

The main objectives of the present invention is to provide a structure of a semiconductor chip with substrate via holes and metal bumps and a fabrication method thereof, so that the integration of the devices in the semiconductor chip can be improved, the chip size can be reduced, the signal transmission speed can be increased, the electric power consumption can be lowered, and heterogeneous integration can be achieved.

To reach the objectives stated above, the present invention provides a structure of a semiconductor chip with substrate via holes and metal bumps which comprises a substrate, at least one backside metal layer, at least one first metal layer, at least one electronic device, and at least one metal bump. The substrate has at least one substrate via hole penetrating through the substrate. The at least one backside metal layer is formed on the backside of the substrate covering the inner surface of the at least one substrate via hole and at least part of the backside of the substrate. The at least one first metal layer is formed on the front side of the substrate, at least part of which is connected to the at least one backside metal layer on the top of at least one of the at least one substrate via hole. The at least one electronic device is formed on the front side of the substrate, at least one of which is connected to at least part of the at least one first metal layer. The at least one metal bump is formed on the at least one first metal layer.

In implementation, a passivation layer may be included on the front side of the substrate to cover at least part of the substrate, the at least one electronic device, and at least part of the at least one first metal layer, and the at least one metal bump and at least part of the at least one first metal layer are not covered by the passivation layer.

In implementation, a redistribution layer may be inserted between the at least one metal bump and the at least one first metal layer, so that the redistribution layer is above the passivation layer and the at least one first metal layer and below the at least one metal bump, and the redistribution layer comprises at least one dielectric layer and at least one second metal layer. The at least one dielectric layer is formed above the passivation layer and the at least one first metal layer to cover at least part of the substrate, the passivation layer, and at least part of the at least first metal layer, and the at least one dielectric layer has at least one dielectric layer via hole penetrating through the at least one dielectric layer. The at least one second metal layer is formed on the dielectric layer to cover the at least one dielectric layer via hole and at least part of the at least one dielectric layer, in which at least part of the at least one second metal layer is connected to the at least one first metal layer, and the metal bump is formed on the at least one second metal layer.

In implementation, the substrate described above is made of GaAs, SiC, GaN, GaN film on SiC or InP.

In implementation, a solder layer is deposited on each of the at least one metal bump described above, and the solder layer is made of In, Sn, In alloys, Sn alloys, or In—Sn alloys.

In implementation, the thickness of the substrate described above is ranging from 10 μm to 300 μm.

In implementation, the at least one backside metal layer described above is made of Au, Cu, Pd, Ni, Ag, Ni alloys, Au alloys, Ni—Au alloys, Ni—Pd alloys, or Pd—Au alloys.

In implementation, the at least one first metal layer described above is made of Au, Cu, or Au alloys.

In implementation, the at least one metal bump described above is made of Cu or Cu alloys.

In implementation, the passivation layer described above is made of SiN.

In implementation, the dielectric layer described above is made of Polybenzoxazole (PBO).

In implementation, the at least one second metal layer described above is made of Au, Cu, or Au alloys.

The present invention also provides a fabrication method of a semiconductor chip with substrate via holes and metal bumps, which comprises steps of:

forming at least one electronic device on a front side of a substrate;

forming at least one first metal layer on the front side of the substrate, wherein at least part of the at least one first metal layer is connected to at least one of the at least one electronic device;

forming at least one metal bump on the at least one first metal layer;

forming a protection film on the front side of the substrate to cover the front side of the substrate, the at least one electronic device, the at least one first metal layer, and the at least one metal bump;

forming a demounting film on the protection film to cover the protection film;

mounting an upper substrate on the demounting film;

grinding and polishing the backside of the substrate;

forming at least one substrate via hole on the backside of the substrate penetrating through the substrate by using photolithography and etching techniques;

depositing at least one backside metal layer on the backside of the substrate to cover the inner surface of the at least one substrate via hole and at least part of the backside of the substrate and to connect the at least one first metal layer on the top of at least one of the at least one substrate via hole;

mounting a lower substrate to the backside of the substrate by using vacuum adsorption;

demounting the upper substrate from the demounting film by heating;

removing the demounting film and the protection film; and removing the lower substrate by releasing the vacuum adsorption.

In implementation, the fabrication method described above may further comprise steps of: forming a passivation layer on the front side of the substrate before forming the protection layer to cover at least part of the substrate, the at least one electronic device, and at least part of the at least one first metal layer, and the at least one metal bump and at least part of the at least one first metal layer are not covered by the passivation layer, and then forming the protection film on the front side of the substrate to cover the front side of the substrate, the at least one first metal layer, the passivation layer, and the at least one metal bump.

In implementation, the fabrication method described above may further comprise steps of: forming a redistribution layer above the passivation layer and the at least one first metal layer before forming the at least one metal bump. The redistribution layer comprises at least one dielectric layer and at least one second metal layer. The at least one dielectric layer is formed above the passivation layer and the at least one first metal layer to cover at least part of the substrate, the passivation layer, and at least part of the at least first metal layer. The at least one dielectric layer has at least one dielectric layer via hole penetrating through the at least one dielectric layer. The at least one second metal layer is formed on the dielectric layer to cover the at least one dielectric layer via hole and at least part of the at least one dielectric layer. At least part of the at least one second metal layer is connected to the at least one first metal layer on the bottom of at least one of the at least one dielectric layer via hole. Then the fabrication method further comprises forming the at least one metal bump on the at least one second metal layer, so that the protection film covers on the redistribution layer, the at least one second metal layer, the at least one dielectric layer, the at least one dielectric layer via hole, and the at least one metal bump.

In implementation, the substrate described above is made of GaAs, SiC, GaN, GaN film on SiC or InP.

In implementation, a solder layer is deposited on each of the at least one metal bump described above, and the solder layer is made of In, Sn, In alloys, Sn alloys, or In—Sn alloys.

In implementation, the thickness of the substrate described above is ranging from 10 μm to 300 μm.

In implementation, the at least one backside metal layer described above is made of Au, Cu, Pd, Ni, Ag, Ni alloys, Au alloys, Ni—Au alloys, Ni—Pd alloys, or Pd—Au alloys.

In implementation, the at least one first metal layer described above is made of Au, Cu, or Au alloys.

In implementation, the at least one metal bump described above is made of Cu or Cu alloys.

In implementation, the passivation layer described above is made of SiN.

In implementation, the dielectric layer described above is made of Polybenzoxazole (PBO).

In implementation, the at least one second metal layer described above is made of Au, Cu, or Au alloys.

In implementation, the upper substrate described above is made of sapphire.

In implementation, the lower substrate described above is made of carbide.

The present invention will be understood more fully by reference to the detailed description of the drawings and the preferred embodiments below.

BRIEF DESCRIPTION OF DRAWINGS

FIG. 2B is a schematic showing the cross-sectional view of another embodiment of a structure of a semiconductor chip with substrate via holes and metal bumps provided by the present invention.

FIG. 2C-2 is a schematic showing the cross-sectional view of another embodiment of a structure of a semiconductor chip with substrate via holes and metal bumps provided by the present invention.

FIG. 2D-1 is a schematic showing the cross-sectional view of another embodiment of a structure of a semiconductor chip with substrate via holes and metal bumps provided by the present invention.

FIG. 2D-2 is a schematic showing the cross-sectional view of another embodiment of a structure of a semiconductor chip with substrate via holes and metal bumps provided by the present invention.

FIG. 2A-0 is a schematic showing the cross-sectional view of an embodiment of the step 1 of the fabrication method of a semiconductor chip with substrate via holes and metal bumps provided by the present invention.

FIG. 2A-1 is a schematic showing the cross-sectional view of an embodiment of the steps 2, 3, and 4 of the fabrication method of a semiconductor chip with substrate via holes and metal bumps provided by the present invention.

FIG. 2A-2 is a schematic showing the cross-sectional view of an embodiment of the step 5 of the fabrication method of a semiconductor chip with substrate via holes and metal bumps provided by the present invention.

FIG. 2A-3 is a schematic showing the cross-sectional view of an embodiment of the step 6 of the fabrication method of a semiconductor chip with substrate via holes and metal bumps provided by the present invention.

FIG. 2A-4 is a schematic showing the cross-sectional view of an embodiment of the step 7 of the fabrication method of a semiconductor chip with substrate via holes and metal bumps provided by the present invention.

FIG. 2A-5 is a schematic showing the cross-sectional view of an embodiment of the step 8 of the fabrication method of a semiconductor chip with substrate via holes and metal bumps provided by the present invention.

FIG. 2A-6 is a schematic showing the cross-sectional view of an embodiment of the step 9 of the fabrication method of a semiconductor chip with substrate via holes and metal bumps provided by the present invention.

FIG. 2A-7 is a schematic showing the cross-sectional view of an embodiment of the step 10 of the fabrication method of a semiconductor chip with substrate via holes and metal bumps provided by the present invention.

FIG. 2B-0 is a schematic showing the cross-sectional view of an embodiment of the step A and steps 2, 3, and 4 of the fabrication method of a semiconductor chip with substrate via holes and metal bumps provided by the present invention.

FIG. 2C-1-0 is a schematic showing the cross-sectional view of an embodiment of the step B and steps 2, 3, and 4 of the fabrication method of a semiconductor chip with substrate via holes and metal bumps provided by the present invention.

FIG. 2C-2-0 is a schematic showing the cross-sectional view of an embodiment of the steps C and D and steps 2, 3, and 4 of the fabrication method of a semiconductor chip with substrate via holes and metal bumps provided by the present invention.

FIG. 2D-1-0 is a schematic showing the cross-sectional view of an embodiment of the steps E, F, G, and H and steps 2, 3, and 4 of the fabrication method of a semiconductor chip with substrate via holes and metal bumps provided by the present invention.

FIG. 2D-2-0 is a schematic showing the cross-sectional view of an embodiment of the steps E, F, G, H and I and steps 2, 3, and 4 of the fabrication method of a semiconductor chip with substrate via holes and metal bumps provided by the present invention.

FIG. 2E is a schematic showing the cross-sectional view of an embodiment of a flip-chip bonded stacked chips provided by the present invention.

FIG. 2F is a schematic showing the cross-sectional view of another embodiment of a flip-chip bonded stacked chips provided by the present invention.

FIG. 3 is a flow chart of an embodiment of the fabrication method of a semiconductor chip with substrate via holes and metal bumps provided by the present invention.

DETAILED DESCRIPTIONS OF PREFERRED EMBODIMENTS

Figure 1A:
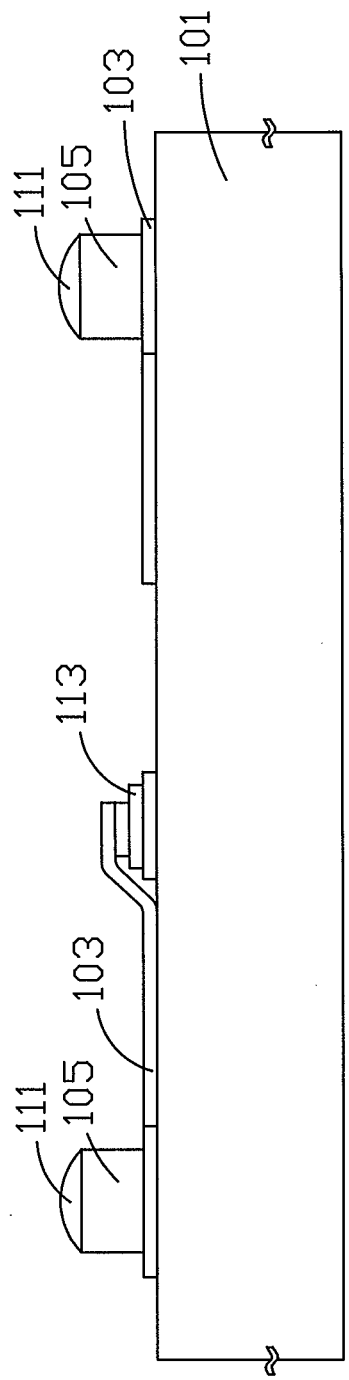
FIG. 1A is a schematic showing the cross-sectional view of a semiconductor chip with copper bumps in a prior art.
Figure 1B:
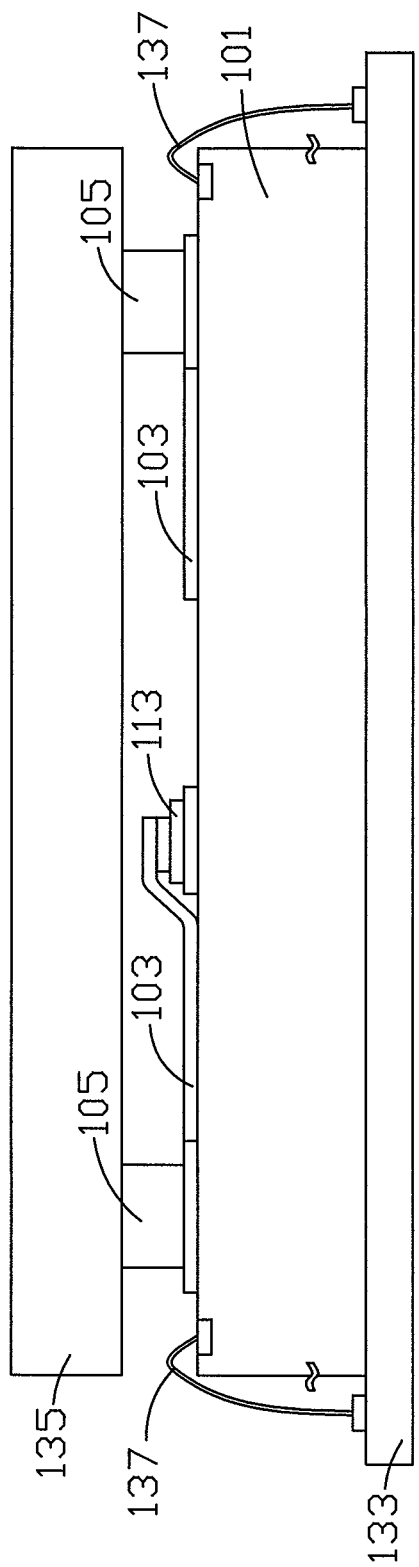
FIG. 1B is a schematic showing the cross-sectional view of flip-chip bonded stacked chips with copper bumps in a prior art.
Figure 2A:
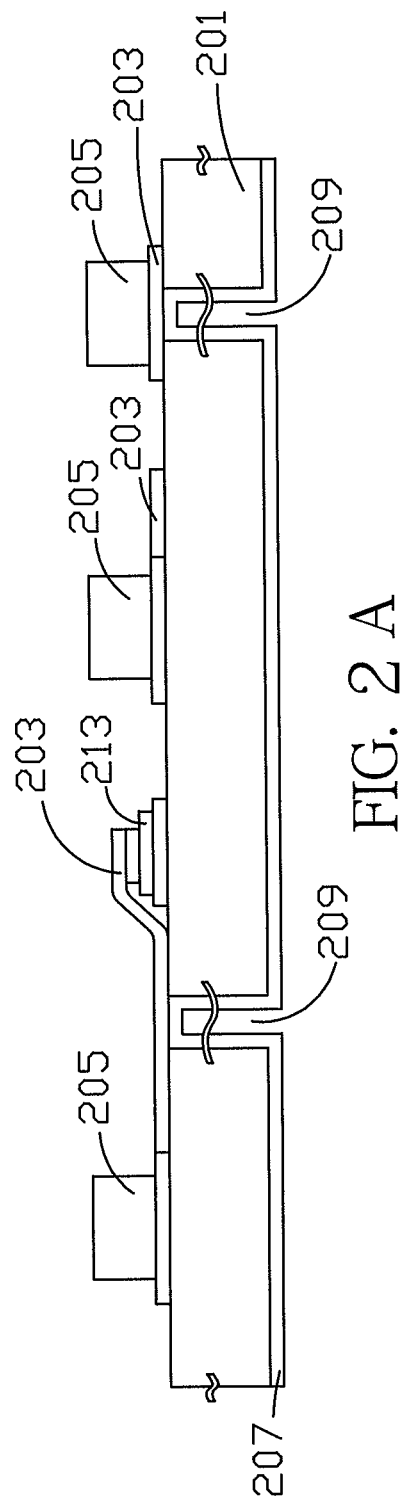
FIG. 2A is a schematic showing the cross-sectional view of an embodiment of a structure of a semiconductor chip with substrate via holes and metal bumps provided by the present invention.

FIG. 2A is a schematic showing the cross-sectional view of an embodiment of a structure of a semiconductor chip with substrate via holes and metal bumps according to the present invention. The structure comprises a substrate 201, which is made preferably of semiconductor materials GaAs, SiC, GaN, GaN film on SiC or InP, and the thickness of the substrate 201 is ranging from 10 µm to 300 µm. At least one electronic device 213 is formed on the front side of the substrate 201. The at least one electronic device 213 is a field effect transistor (FET), a heterojunction bipolar transistor (HBT), a resistor, a capacitor, an inductor, or a combination of the above semiconductor electronic devices. At least one first metal layer 203 is formed on the front side of the substrate 201. The at least one first metal layer 203 is made preferably of Au, Cu, or Au alloys or Cu alloys, and the thickness of the at least one first metal layer 203 is equal to or larger than 3 µm. At least part of the at least one first metal layer 203 is connected to at least one of the at least one electronic device 213. At least one metal bump 205 is formed on the at least one first metal layer 203. The at least one metal bump 205 is made preferably of Cu, Au or Cu alloys. At least one substrate via hole 209 is formed on the backside of the substrate 201 and penetrates through the substrate 201 by etching. At least one backside metal layer 207 is deposited on the backside of the substrate 201 to cover the inner surface of the at least one substrate via hole 209 and at least part of the backside of the substrate 201. The at least one backside metal layer 207 is made preferably of Au, Cu, Pd, Ni, Ag, Ni alloys, Au alloys, Ni—Au alloys, Ni—Pd alloys, or Pd—Au alloys.

FIG. 2B is a schematic showing the cross-sectional view of another embodiment provided by the present invention. The structure is mostly similar to the structure shown in FIG. 2A, except that a solder layer 211 is deposited on each of the at least one metal bump 205. The solder layer 211 is made preferably of In, Sn, In alloys, Sn alloys, or In—Sn alloys.

Figure 2:
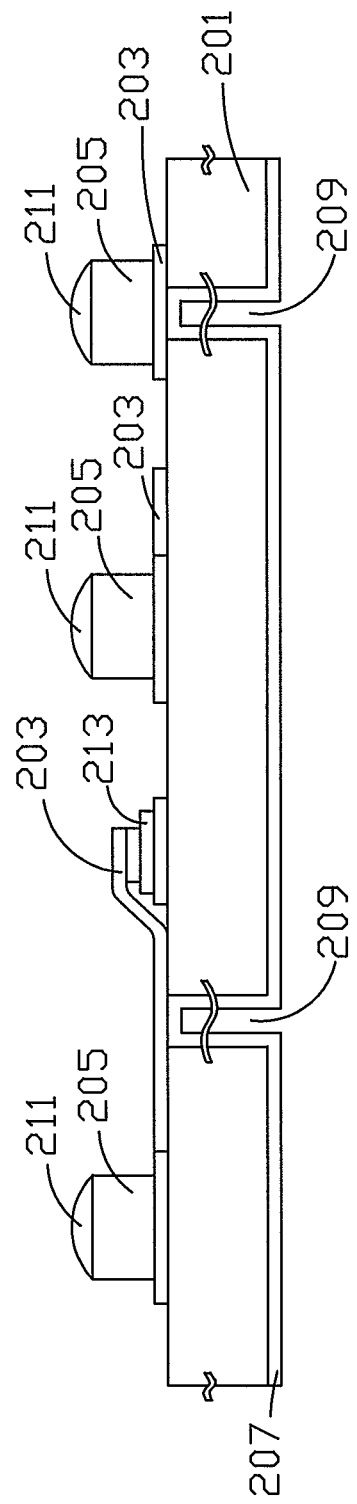
Figures 1, 2C:
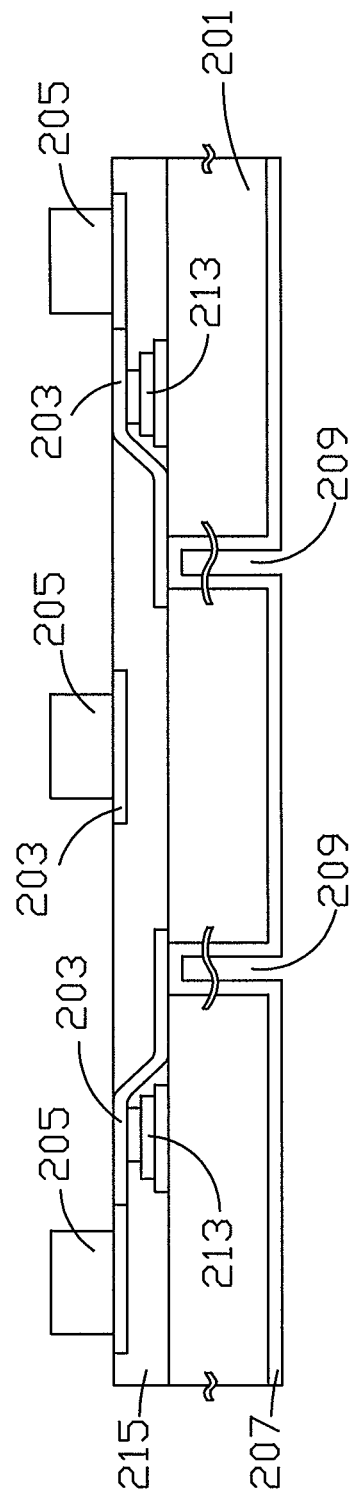
FIG. 2C-1 is a schematic showing the cross-sectional view of another embodiment of a structure of a semiconductor chip with substrate via holes and metal bumps provided by the present invention.
Figures 2, 2C:
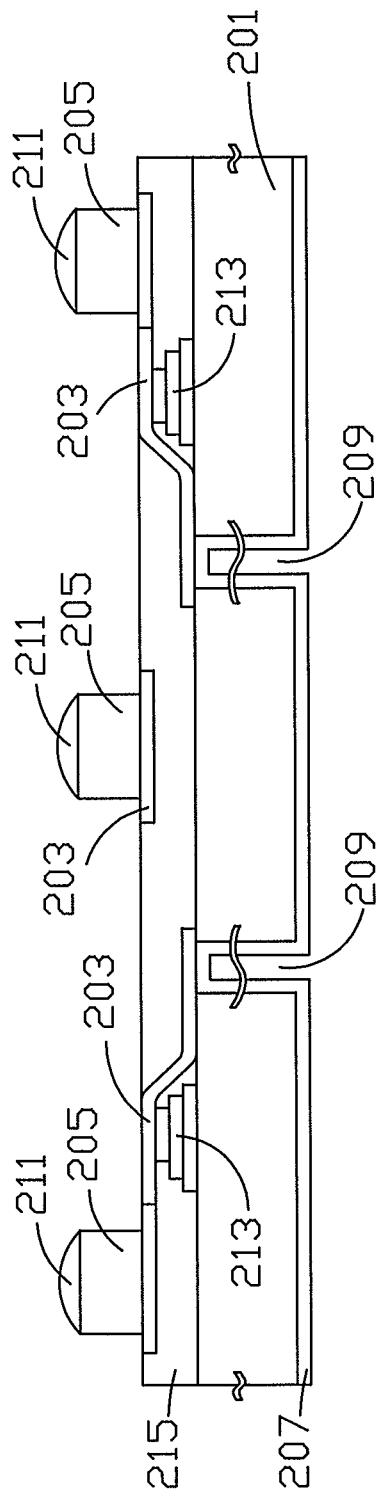

FIG. 2C-1 is a schematic showing the cross-sectional view of another embodiment provided by the present invention. The structure is mostly similar to the structure shown in FIG. 2A, except that a passivation layer 215 is included on the front side of the substrate 201 to cover at least part of the substrate 201, the at least one electronic device 213, and at least part of the at least one first metal layer 203, and the at least one metal bump 205 and at least part of the at least one first metal layer 203 are not covered by the passivation layer 215. The passivation layer 215 is made preferably of SiN.

FIG. 2C-2 is a schematic showing the cross-sectional view of another embodiment provided by the present invention. The structure is mostly similar to the structure shown in FIG. 2C-1, except that a solder layer 211 is deposited on each of the at least one metal bump 205. The solder layer 211 is made preferably of In, Sn, In alloys, Sn alloys, or In—Sn alloys.

Figures 1, 2D:
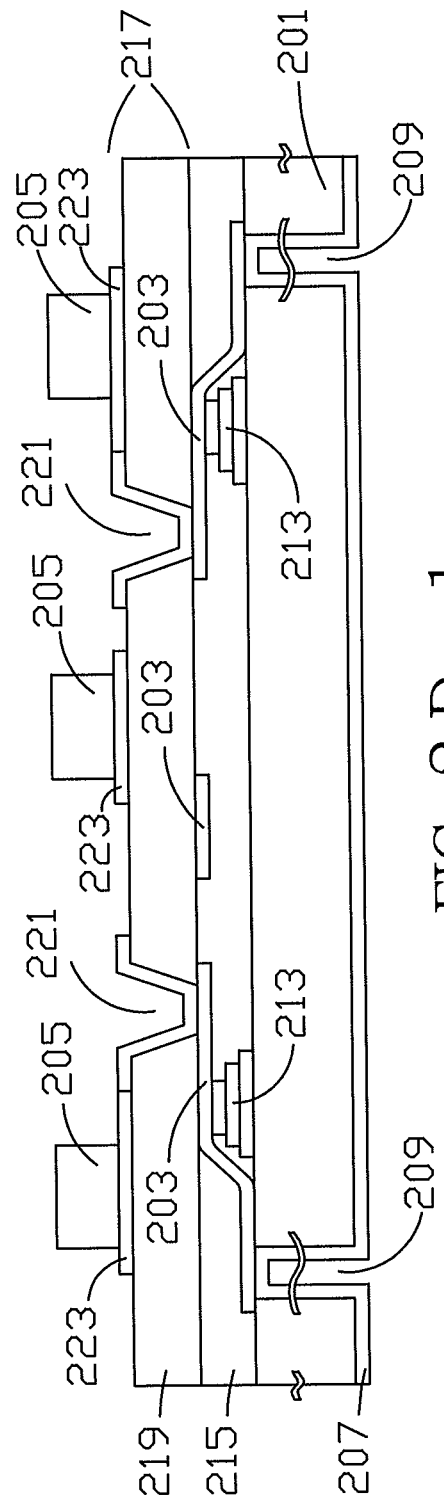
Figures 2, 2D:
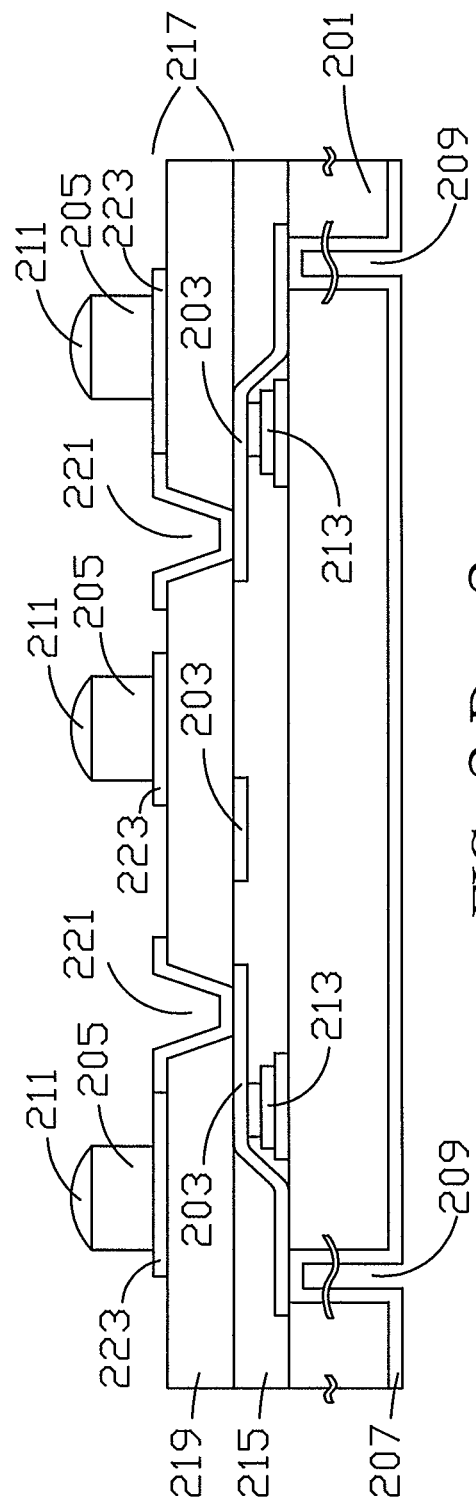

FIG. 2D-1 is a schematic showing the cross-sectional view of another embodiment provided by the present invention. The structure is mostly similar to the structure shown in FIG. 2C-1, except that a redistribution layer 217 is inserted between the at least one metal bump 205 and the at least one first metal layer 203, so that the redistribution layer 217 is above the passivation layer 215 and the at least one first metal layer 203 and below the at least one metal bump 205. The redistribution layer 217 comprises at least one dielectric layer 219 and at least one second metal layer 223. The at least one dielectric layer 219 is formed above the passivation layer 215 and the at least one first metal layer 203 to cover at least part of the substrate 201, the passivation layer 215, and at least part of the at least first metal layer 203. The dielectric layer 219 is made preferably of Polybenzoxazole (PBO), and the thickness of the dielectric layer 219 is ranging from 5 µm to 30 µm. The at least one dielectric layer 219 has at least one dielectric layer via hole 221 penetrating through the at least one dielectric layer 219. The at least one second metal layer 223 is formed on the dielectric layer 219 to cover the at least one dielectric layer via hole 221 and at least part of the at least one dielectric layer 219. At least part of the at least one second metal layer 223 is connected to the at least one first metal layer 203 at the bottom of the dielectric via hole 221. The at least one second metal layer 223 is made preferably of Au, Cu, or Au alloys. The metal bump 205 is then formed on the at least one second metal layer 223. By including the redistribution layer 217, the metal bump 205 can be disposed on a suitable location. The electric signal can be transmitted through the backside metal layer 207 and at least one of the at least one first metal layer 203 to at least one of the at least one electronic device 213, and then through at least one of the at least one first metal layer 203 and at least one of the at least one second metal layer 223 to the metal bump 205.

FIG. 2D-2 is a schematic showing the cross-sectional view of another embodiment provided by the present invention. The structure is mostly similar to the structure shown in FIG. 2D-1, except that a solder layer 211 is deposited on each of the at least one metal bump 205. The solder layer 211 is made preferably of In, Sn, In alloys, Sn alloys, or In—Sn alloys.

Figures 0, 2A:
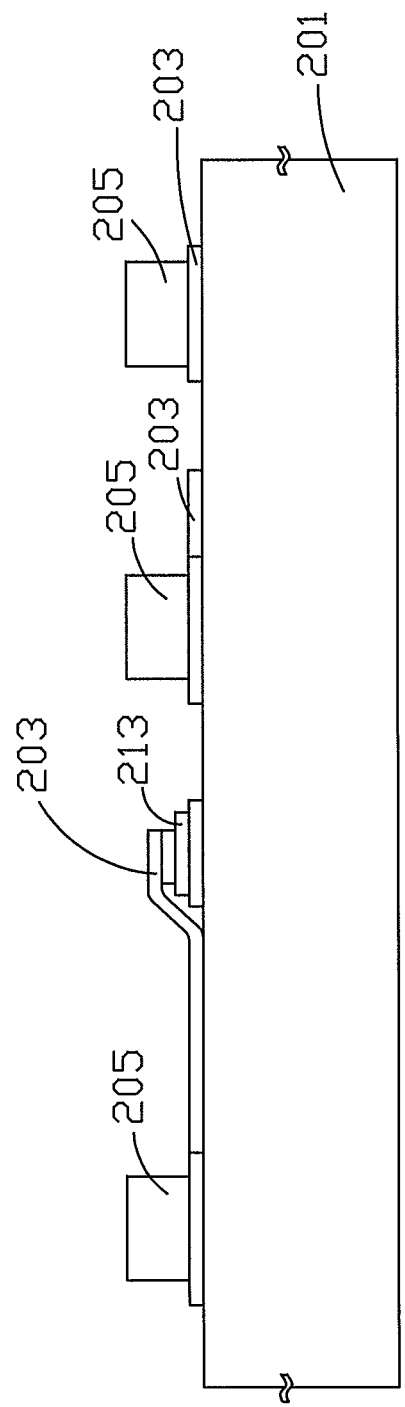
Figures 1, 2A:
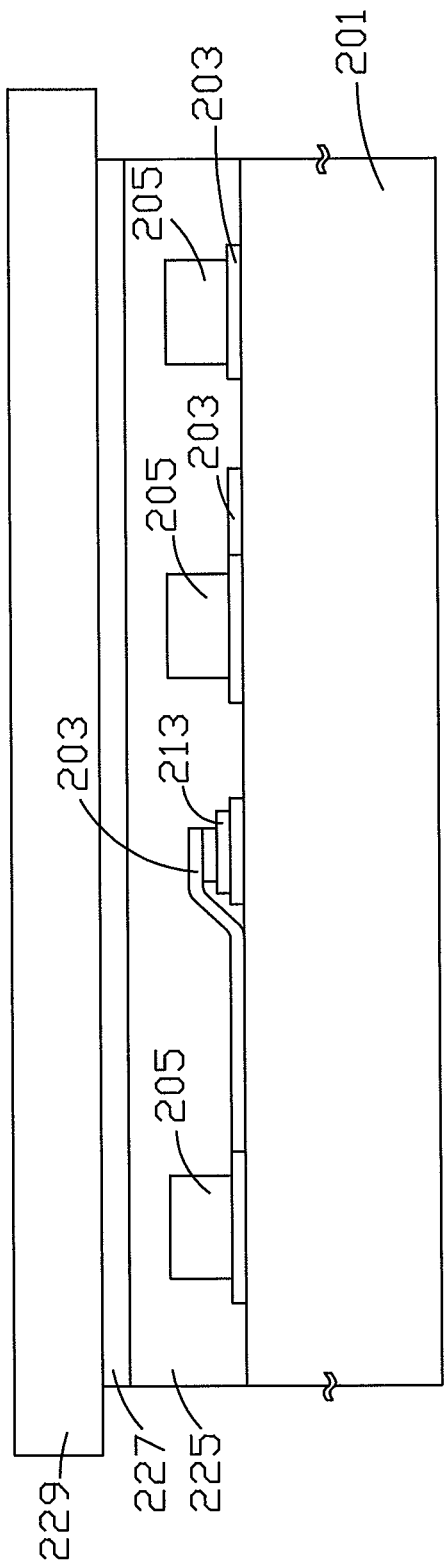
Figures 2, 2A:
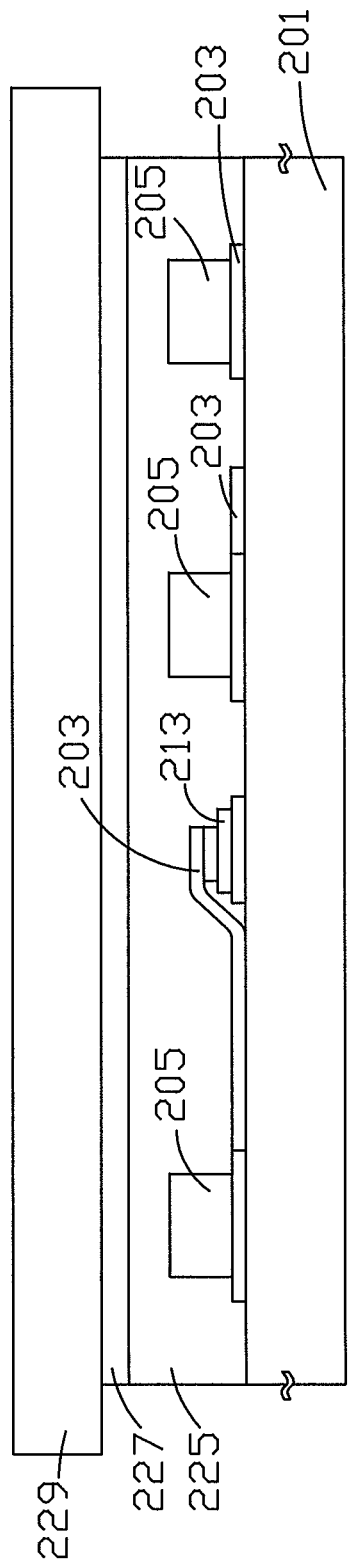
Figures 2, 2A, 3:
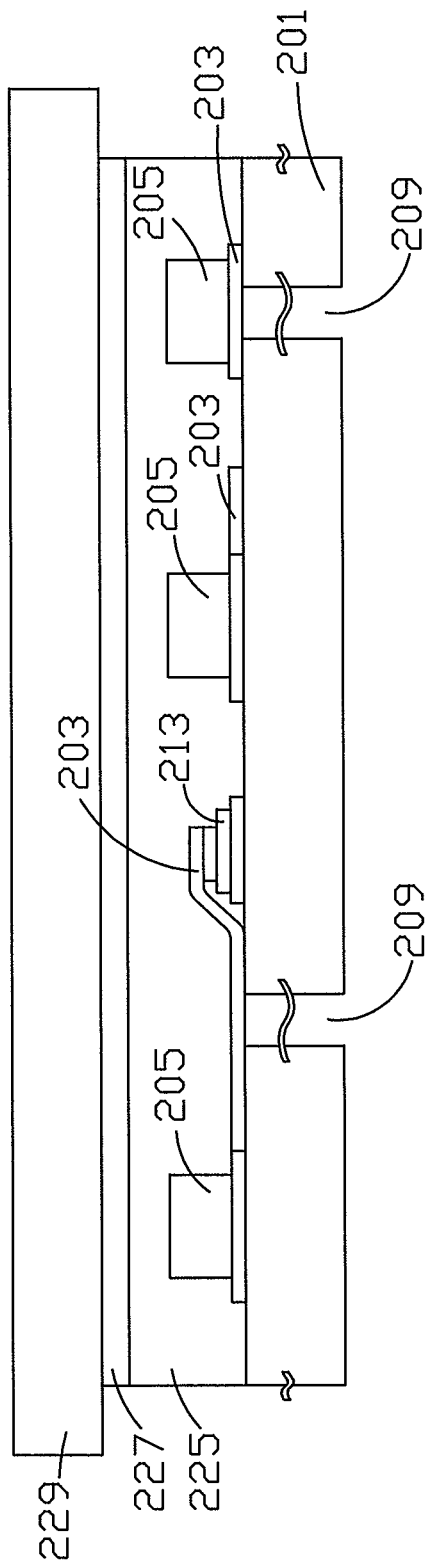
Figures 2, 2A, 3, 4:
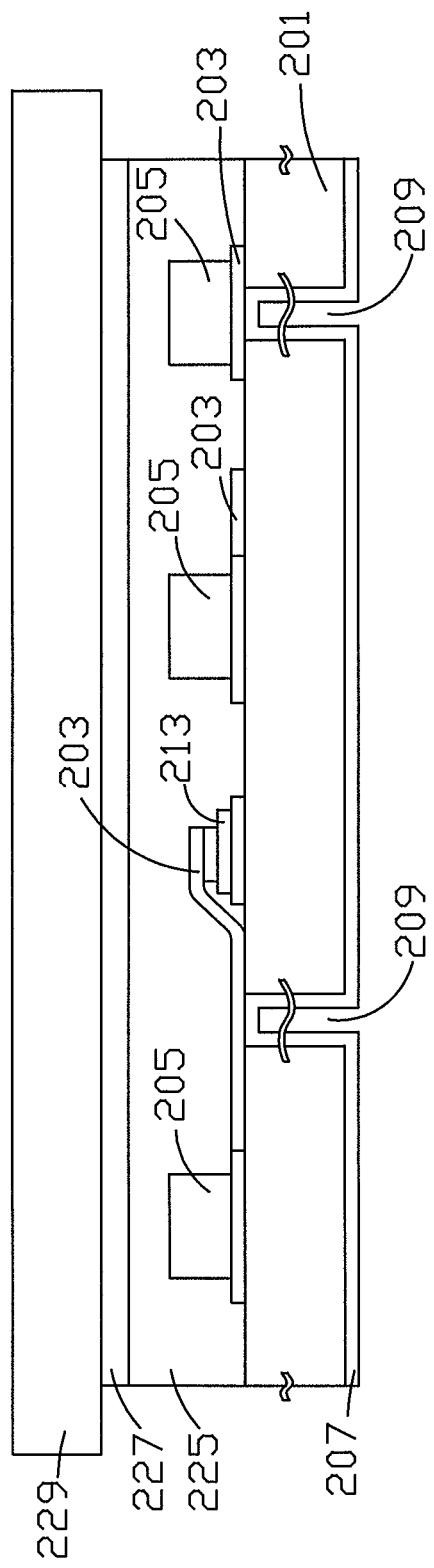
Figures 2, 2A, 3, 4, 5:
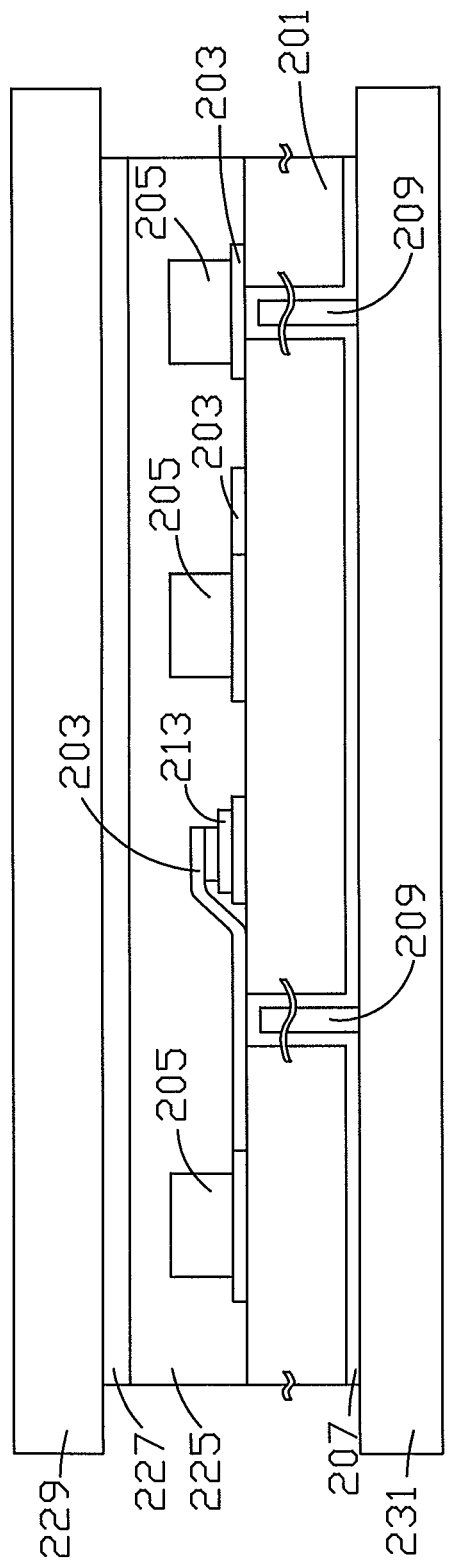
Figures 2, 2A, 3, 4, 5, 6:
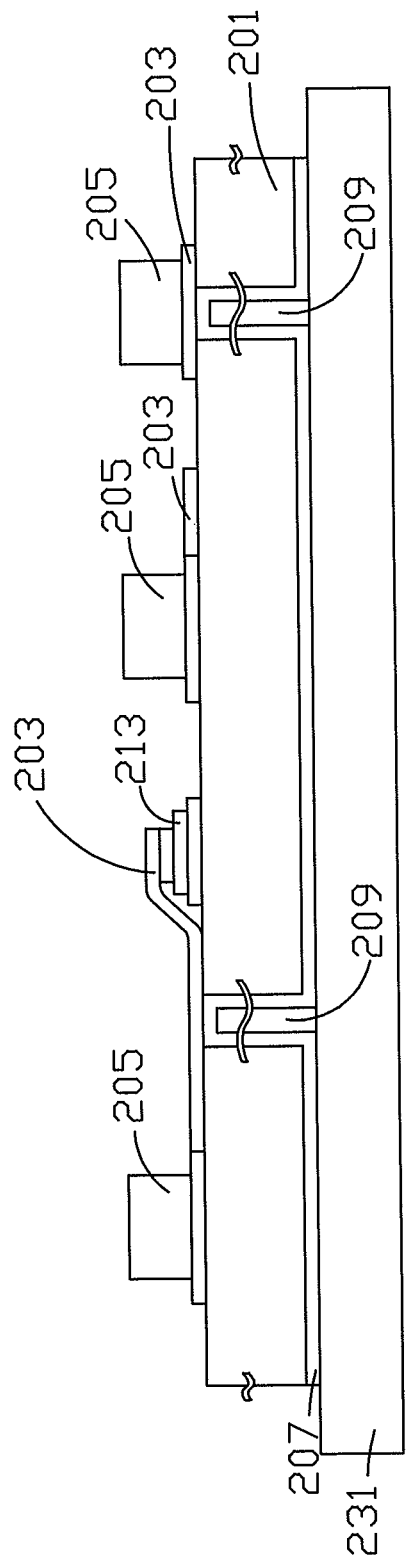
Figures 2, 2A, 3, 4, 5, 6, 7:
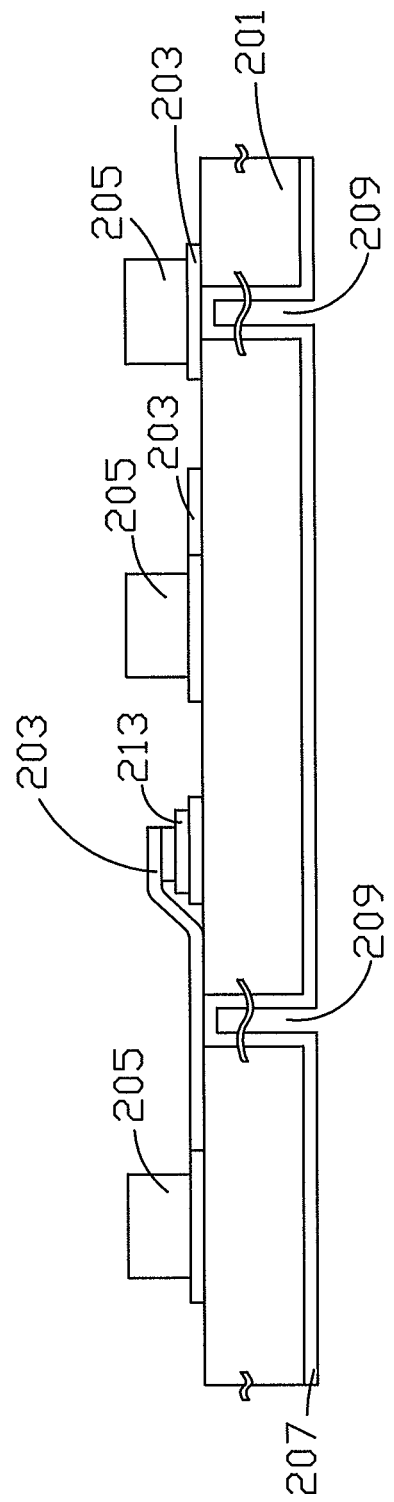
Figure 2:
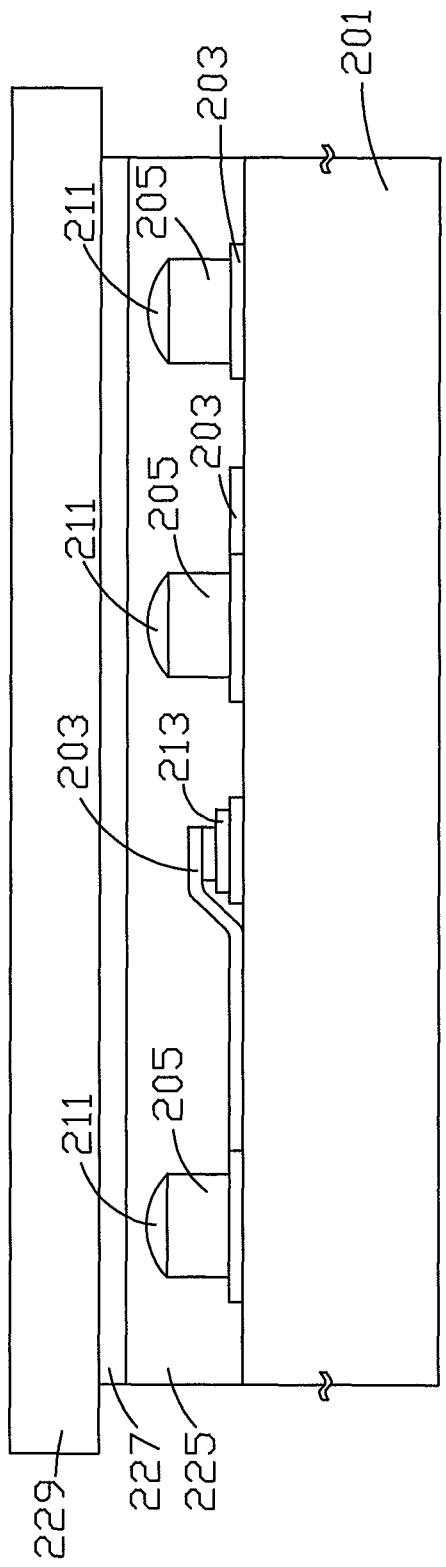
Figures 0, 1, 2C:
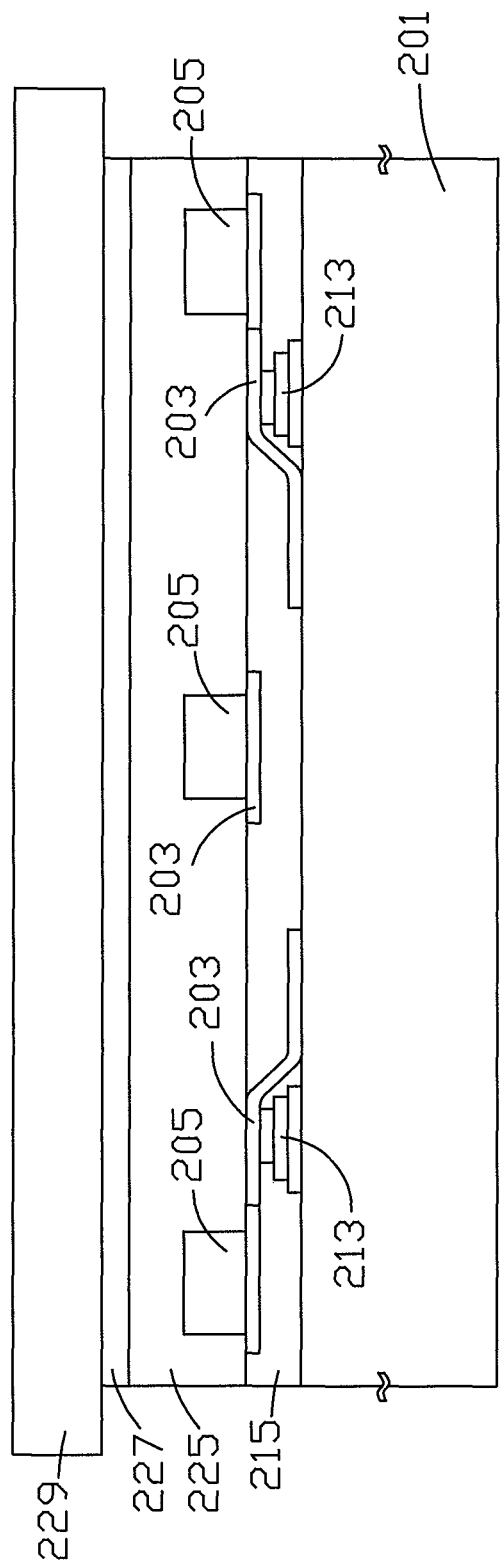
Figures 0, 2, 2C:
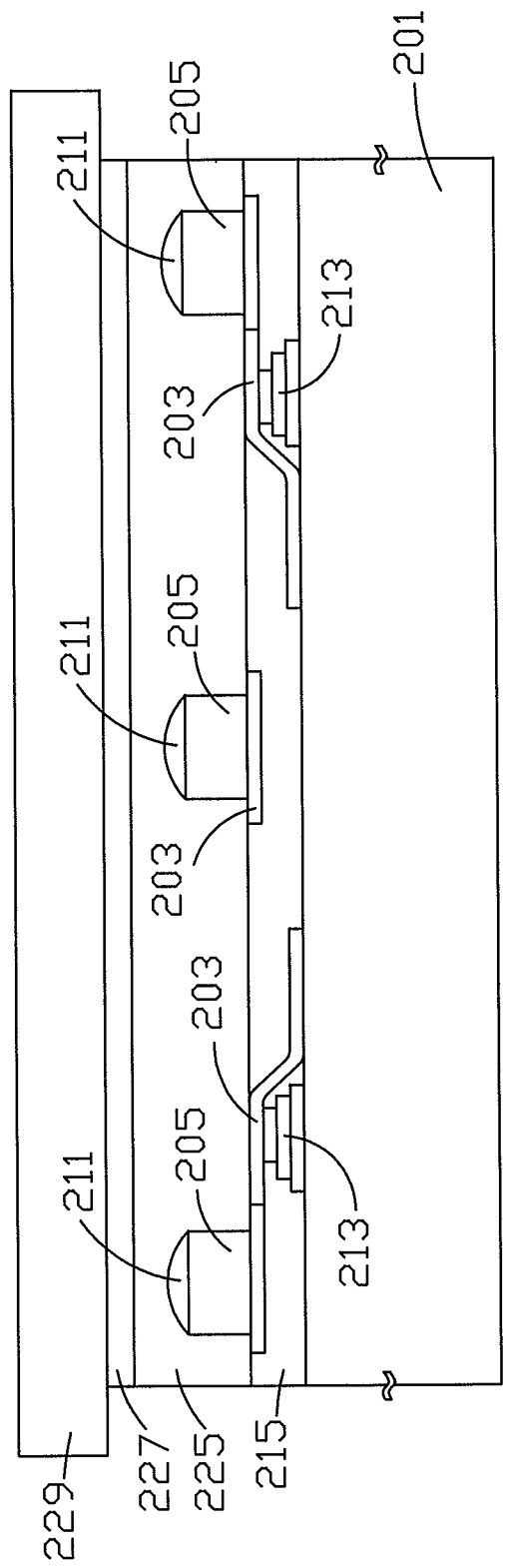
Figures 0, 1, 2D:
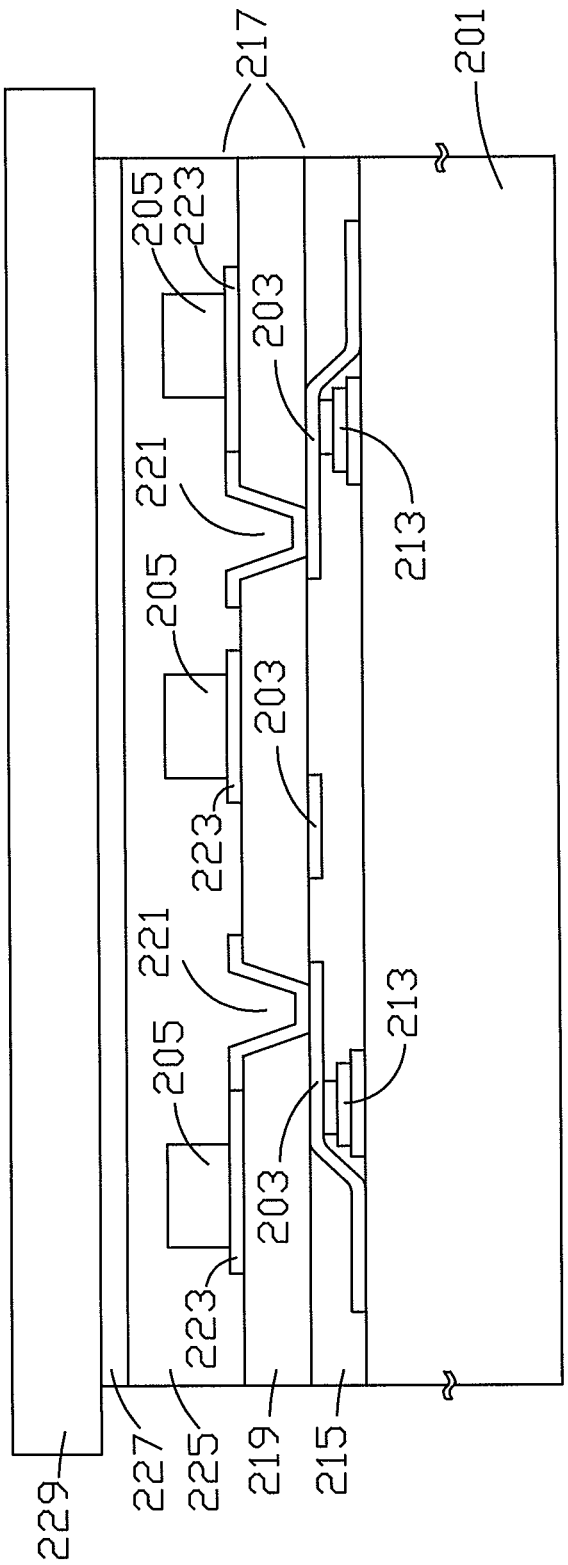
Figures 0, 2, 2D:
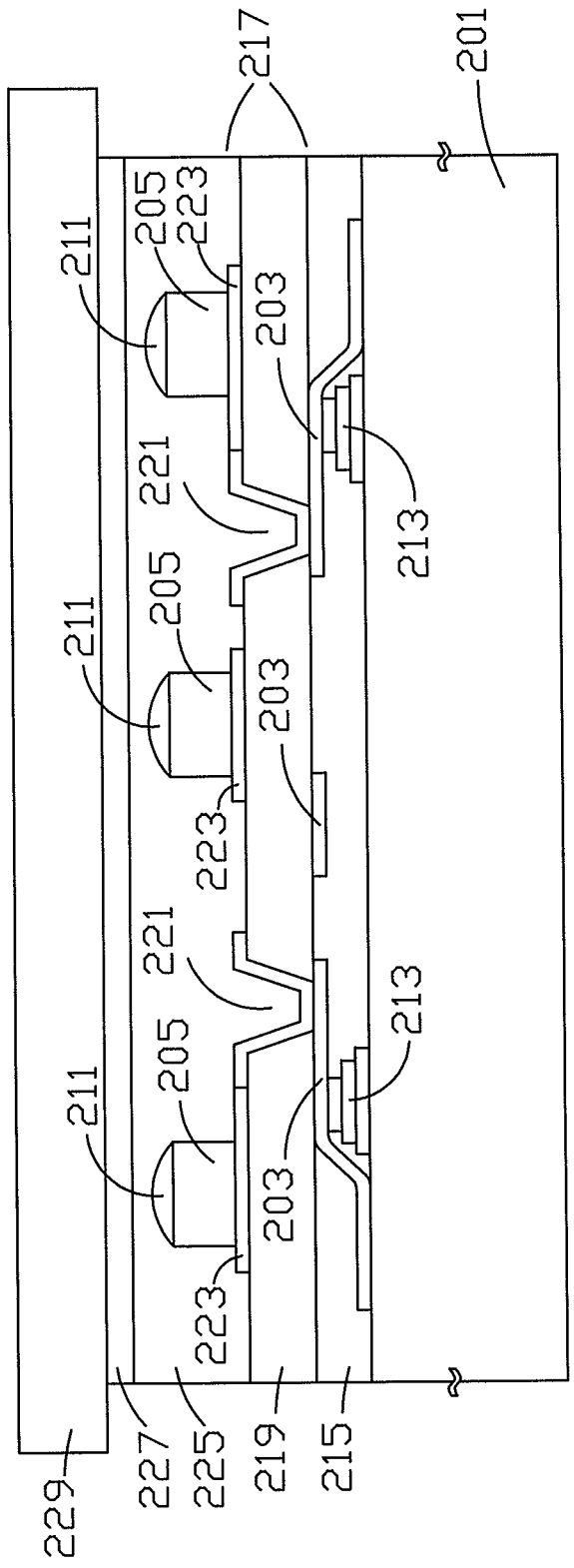
Figure 2:
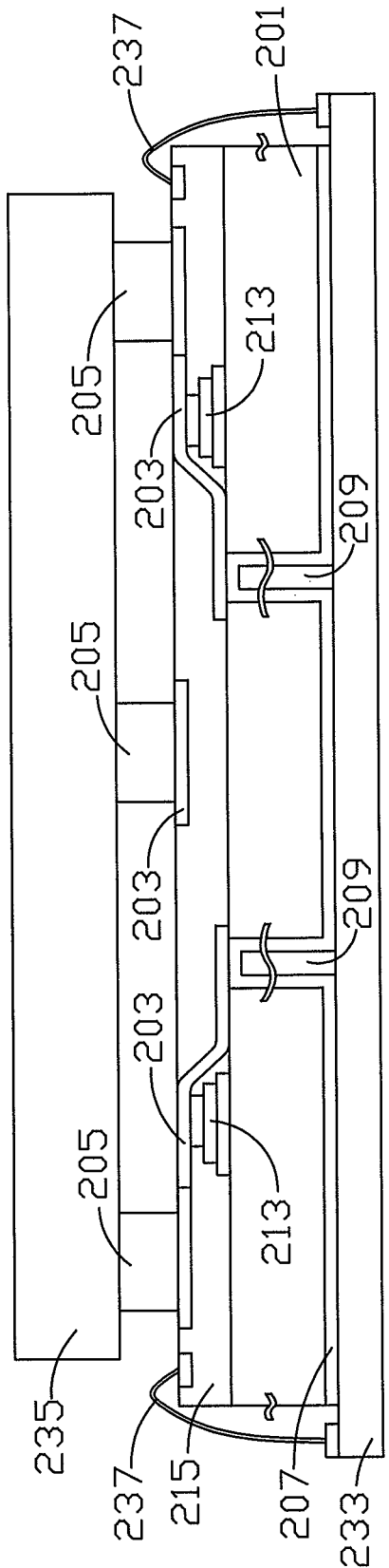
Figure 2:
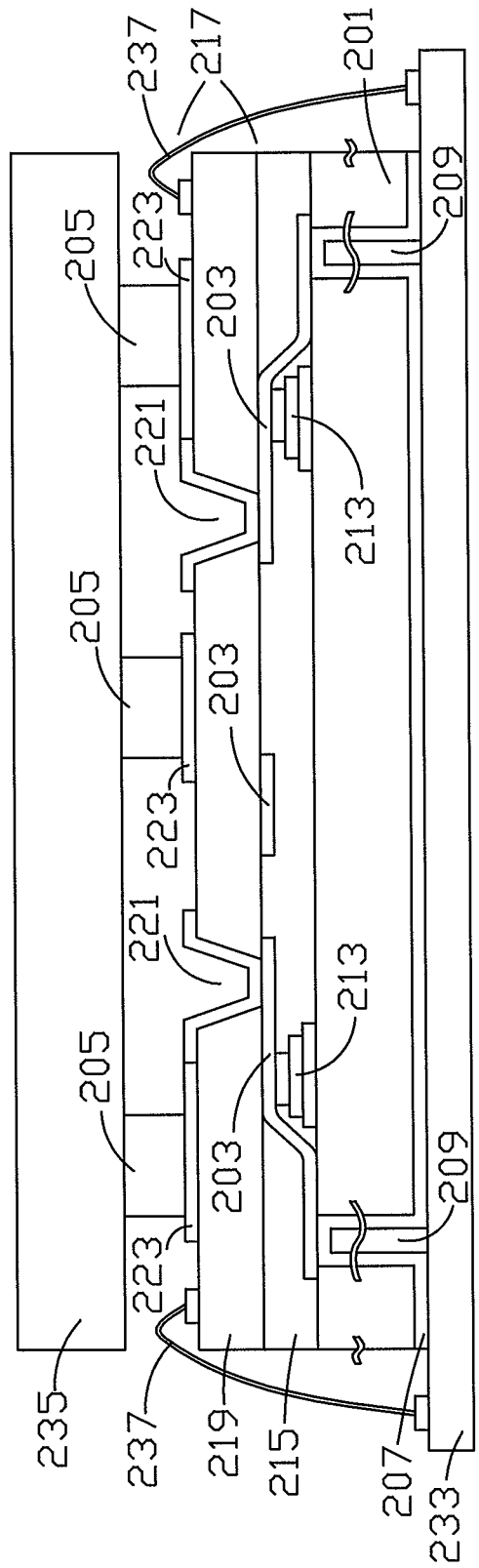

FIG. 3 is a flow chart of an embodiment of the fabrication method of a semiconductor chip with substrate via holes and metal bumps provided by the present invention. An embodiment of the fabrication method of the structure of a semiconductor chip with substrate via holes and metal bumps shown in FIG. 2A comprises steps of:

Step 1: as shown in FIG. 2A-0, forming at least one electronic device 213 on a front side of a substrate 201; forming at least one first metal layer 203 on the front side of the substrate 201, in which at least part of the at least one first metal layer 203 is electrically connected to at least one of the at least one electronic device 213; and forming at least one metal bump 205 on the at least one first metal layer 203. The substrate 201 is made preferably of semiconductor materials GaAs, SiC, GaN, GaN film on SiC or InP, and the thickness of the substrate 201 is ranging from 10 μm to 300 μm, the electronic device 213 is an FET, an HBT, a resistor, a capacitor, or a inductor, or a combination of the semiconductor electronic devices described above. The at least one first metal layer 203 is made preferably of Au, Cu, or Au alloys, and the thickness of the at least one first metal layer 203 is equal to or larger than 3 μm. The at least one metal bump 205 is made preferably of Cu or Cu alloys.

Step 2: as shown in FIG. 2A-1, forming a protection film 225 on the front side of the substrate 201 to cover the front side of the substrate 201, the at least one electronic device 213, the at least one first metal layer 203, and the at least one metal bump 205.

Step 3: as shown in FIG. 2A-1, forming a demounting film 227 on the protection film 225 to cover the protection film 225.

Step 4: as shown in FIG. 2A-1, mounting an upper substrate 229 on the demounting film 227. The upper substrate described above is made preferably of sapphire.

Step 5: as shown in FIG. 2A-2, grinding and polishing the backside of the substrate 201.

Step 6: as shown in FIG. 2A-3, forming at least one substrate via hole 209 on the backside of the substrate 201 penetrating through the substrate 201 by photolithography and etching techniques.

Step 7: as shown in FIG. 2A-4, depositing at least one backside metal layer 207 on the backside of the substrate 201 to cover the inner surface of the at least one substrate via hole 209 and at least part of the backside of the substrate 201 and to connect the at least one first metal layer 207 on the top of at least one of the at least one substrate via hole 209. The at least one backside metal layer described above is made preferably of Au, Cu, Pd, Ni, Ag, Ni alloys, Au alloys, Ni—Au alloys, Ni—Pd alloys, or Pd—Au alloys.

Step 8: as shown in FIG. 2A-5, mounting a lower substrate 231 to the backside of the substrate 201 by using vacuum adsorption. The lower substrate described above is made preferably of carbide.

Step 9: as shown in FIGS. 2A-5 and 2A-6, demounting the upper substrate 229 from the demounting film 227 by heating; removing the demounting film 227 and the protection film 225.

Step 10: as shown in FIGS. 2A-6 and 2A-7, removing the lower substrate 231 by releasing the vacuum adsorption.

To fabricate the structure of a semiconductor chip with substrate via holes and metal bumps shown in FIG. 2B, the following steps must be included between Step 1 and 2 described in the above 10 steps shown in FIG. 3:

Step A: as shown in FIG. 2B-0, depositing a solder layer 211 on each of the at least one metal bump 205, in which the solder layer 211 is made preferably of In, Sn, In alloys, Sn alloys, or In—Sn alloys.

To fabricate the structure of a semiconductor chip with substrate via holes and metal bumps shown in FIG. 2C-1, the following steps must be included between Step 1 and 2 described in the above 10 steps shown in FIG. 3:

Step B: as shown in FIG. 2C-1-0, forming a passivation layer 215 on the front side of the substrate 201 to cover at least part of the substrate 201, the at least one electronic device 213, and at least part of the at least one first metal layer 203, and the at least one metal bump 205 and at least part of the at least one first metal layer 203 are not covered by the passivation layer 215, in which the passivation layer 215 is made preferably of SiN, and the protection film 225 in Step 2 turns to cover the front side of the substrate 201, the at least one first metal layer 203, the passivation layer 215, and the at least one metal bump 205.

To fabricate the structure of a semiconductor chip with substrate via holes and metal bumps shown in FIG. 2C-2, the following steps must be included between Step 1 and 2 described in the above 10 steps shown in FIG. 3:

Step C: as shown in FIG. 2C-2-0, forming a passivation layer 215 on the front side of the substrate 201 to cover at least part of the substrate 201, the at least one electronic device 213, and at least part of the at least one first metal layer 203, and the at least one metal bump 205 and at least part of the at least one first metal layer 203 are not covered by the passivation layer 215, in which the passivation layer 215 is made preferably of SiN.

Step D: as shown in FIG. 2C-2-0, depositing a solder layer 211 on each of the at least one metal bump 205, in which the solder layer 211 is made preferably of In, Sn, In alloys, Sn alloys, or In—Sn alloys.

The protection film 225 in Step 2 turns to cover the front side of the substrate 201, the at least one first metal layer 203, the passivation layer 215, and the at least one metal bump 205.

To fabricate the structure of a semiconductor chip with substrate via holes and metal bumps shown in FIG. 2D-1, the Step 1 described in the above 10 steps shown in FIG. 3 is replaced by the following steps:

Step E: as shown in FIG. 2D-1-0, forming at least one electronic device 213 on the front side of the substrate 201; and forming at least one first metal layer 203 on the front side of the substrate 201, in which at least part of the at least one first metal layer 203 is electrically connected to at least one of the at least one electronic device 213.

Step F: as shown in FIG. 2D-1-0, forming a passivation layer 215 on the front side of the substrate 201 to cover at least part of the substrate 201, the at least one electronic device 213, and at least part of the at least one first metal layer 203, and the at least one metal bump 205 and at least part of the at least one first metal layer 203 are not covered by the passivation layer 215, in which the passivation layer 215 is made preferably of SiN.

Step G: as shown in FIG. 2D-1-0, forming a redistribution layer 217 above the passivation layer 215 and the at least one first metal layer 203, in which the redistribution layer 217 comprises at least one dielectric layer 219 formed above the passivation layer 215 and the at least one first metal layer 203 to cover at least part of the substrate 201, the passivation layer 215, and at least part of the at least first metal layer 203, and the at least one dielectric layer 219 has at least one dielectric layer via hole 221 penetrating through the at least one dielectric layer 219. The at least one dielectric layer 219 is made preferably of PBO, and the thickness of the dielectric layer 219 is ranging from 5 μm to 30 μm. The redistribution layer 217 also comprises at least one second metal layer 223 formed on the dielectric layer 219 to cover the at least one dielectric layer via hole 221 and at least part of the at least one dielectric layer 219, and the at least one second metal layer 223 connected to the at least one first metal layer 203 on the bottom of at least one of the at least one dielectric layer via hole 221. The at least one second metal layer 223 is made preferably of Au, Cu, or Au alloys.

Step H: as shown in FIG. 2D-1-0, forming at least one metal bump 205 on the at least one second metal layer 223. The protection film 225 in Step 2 turns to cover the redistribution layer 217, the at least one second metal layer 223, the at least one dielectric layer 219, the at least one dielectric layer via hole 221, and the at least one metal bump 205.

To fabricate the structure of a semiconductor chip with substrate via holes and metal bumps shown in FIG. 2D-2, besides replacing Step 1 in the above 10 steps shown in FIG. 3 to Step E, F, G, and H, the following steps must be included after Step H and before Step 2:

Step I: as shown in FIG. 2D-2-0, depositing a solder layer 211 on each of the at least one metal bump 205, in which the solder layer 211 is made preferably of In, Sn, In alloys, Sn alloys, or In—Sn alloys.

FIG. 2E is a schematic showing the cross-sectional view of another embodiment provided by the present invention. The structure is mostly similar to the structure shown in FIG. 2C-1, except that an upper chip 235 is mounted on the at least one metal bump 205 by bonding to the at least one metal bump 205. The upper chip 235 comprises at least one semiconductor electronic device. The electric signal can be transmitted through the backside metal layer 207 and at least one of the at least one first metal layer 203 to at least one of the at least one electronic device 213, then through at least one of the at least one first metal layer 203 to the metal bump 205, and finally through the metal bump 205 to the semiconductor electronic device of the upper chip 235. A module substrate 233 can be mounted below the backside metal layer 207. At least one bonding wire 237 is disposed on the module substrate 233. The electric signal from the electronic device 213 can be transmitted through the bonding wire 237 to the module substrate 233.

FIG. 2F is a schematic showing the cross-sectional view of another embodiment provided by the present invention. The structure is mostly similar to the structure shown in FIG. 2D-1, except that an upper chip 235 is mounted on the at least one metal bump 205 by bonding to the at least one metal bump 205. The upper chip 235 comprises at least one semiconductor electronic device. By including the redistribution layer 217, the metal bumps 205 can be disposed on a suitable location for connecting to the corresponding bond points on the upper chip 235. The electric signal can be transmitted through the backside metal layer 207 and at least one of the at least one first metal layer 203 to at least one of the at least one electronic device 213, then through at least one of the at least one first metal layer 203 and at least one of the at least one second metal layer 223 to the metal bump 205, and finally through the metal bump 205 to the semiconductor electronic device of the upper chip 235. A module substrate 233 can be disposed below the backside metal layer 207. At least one bonding wire 237 is disposed on the module substrate 233. The electric signal from the electronic device 213 can be transmitted through the bonding wire 237 to the module substrate 233.

To sum up, the structure of a semiconductor chip with substrate via holes and metal bumps and a fabrication method thereof provided by the present invention can improve the integration of the devices in the semiconductor chip, reduce the chip size, increase the signal transmission speed, lower the electric power consumption, and achieve heterogeneous integration. The present invention can indeed get its anticipated object, and furthermore, the present invention can indeed improve the process stability and the device reliability.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

What is claimed is:

1. A fabrication method of a semiconductor chip with substrate via holes and metal bumps, comprising steps of:
   forming at least one electronic device on a front side of a substrate;
   forming at least one first metal layer on the front side of the substrate, wherein at least part of the at least one first metal layer is connected to at least one of the at least one electronic device;
   forming at least one metal bump on the at least one first metal layer;
   forming a protection film on the front side of the substrate to cover the front side of the substrate, the at least one electronic device, the at least one first metal layer, and the at least one metal bump;
   forming a demounting film on the protection film to cover the protection film;
   mounting an upper substrate on the demounting film;
   grinding and polishing the backside of the substrate;
   forming at least one substrate via hole on the backside of the substrate penetrating through the substrate by using photolithography and etching techniques;
   depositing at least one backside metal layer on the backside of the substrate to cover the inner surface of the at least one substrate via hole and at least part of the backside of the substrate and to connect the at least one first metal layer on the top at least one of the at least one substrate via hole;
   mounting a lower substrate to the backside of the substrate by using vacuum adsorption;
   demounting the upper substrate from the demounting film by heating;
   removing the demounting film and the protection film; and
   removing the lower substrate by releasing the vacuum adsorption.

2. The fabrication method according to claim 1 further including steps of:
   forming a passivation layer on the front side of the substrate before forming the protection layer to cover at least part of the substrate, the at least one electronic device, and at least part of the at least one first metal layer, and the at least one metal bump and at least part of the at least one first metal layer are not covered by the passivation layer; and then forming the protection film on the front side of the substrate to cover the front side of the substrate, the at least one first metal layer, the passivation layer, and the at least one metal bump.

3. The fabrication method according to claim 2, wherein the passivation layer is made of SiN.

4. The fabrication method according to claim 2 further including steps of:

forming a redistribution layer above the passivation layer and the at least one first metal layer before forming the at least one metal bump, wherein the redistribution layer comprises at least one dielectric layer formed above the passivation layer and the at least one first metal layer to cover at least part of the substrate, the passivation layer, and at least part of the at least first metal layer, and the at least one dielectric layer having at least one dielectric layer via hole penetrating through the at least one dielectric layer, and at least one second metal layer formed on the dielectric layer to cover the at least one dielectric layer via hole and at least part of the at least one dielectric layer, at least part of the at least one second metal layer is connected to the at least one first metal layer on the bottom of at least one of the at least one dielectric layer via hole; and forming the at least one metal bump on the at least one second metal layer, so that the protection film covers on the redistribution layer, the at least one second metal layer, the at least one dielectric layer, the at least one dielectric layer via hole, and the at least one metal bump.

5. The fabrication method according to claim 4, wherein the at least one dielectric layer is made of dielectric material Polybenzoxazole (PBO).

6. The fabrication method according to claim 4, wherein the at least one second metal layer is made of Au, Cu, or Au alloys.

7. The fabrication method according to claim 1, wherein the substrate is made of GaAs, SiC, GaN, GaN film on SiC or InP.

8. The fabrication method according to claim 1, wherein a solder layer is deposited on each of the at least one metal bump, and the solder layer is made of In, Sn, In alloys, Sn alloys, or In—Sn alloys.

9. The fabrication method according to claim 1, wherein the thickness of the substrate is ranging from 10 μm to 300 μm.

10. The fabrication method according to claim 1, wherein the at least one backside metal layer is made of Au, Cu, Pd, Ni, Ag, Ni alloys, Au alloys, Ni—Au alloys, Ni—Pd alloys, or Pd—Au alloys.

11. The fabrication method according to claim 1, wherein the at least one first metal layer is made of Au, Cu, or Au alloys.

12. The fabrication method according to claim 1, wherein the at least one metal bump is made of Cu or Cu alloys.

13. The fabrication method according to claim 1, wherein the upper substrate is made of sapphire.

14. The fabrication method according to claim 1, wherein the lower substrate is made of carbide.

* * * * *